United States Patent

Ting et al.

[11] Patent Number: 5,850,564
[45] Date of Patent: Dec. 15, 1998

[54] SCALABLE MULTIPLE LEVEL TAB ORIENTED INTERCONNECT ARCHITECTURE

[75] Inventors: Benjamin S. Ting, Saratoga; Peter M. Pani, Mountain View, both of Calif.

[73] Assignee: BTR, Inc,, Reno, Nev.

[21] Appl. No.: 434,980

[22] Filed: May 3, 1995

[51] Int. Cl.⁶ .................................................. G06F 13/40
[52] U.S. Cl. .............................. 395/800.37; 395/800.38; 395/800.389; 395/800.1; 395/800.11
[58] Field of Search .............................. 395/800, 800.37, 395/800.38, 800.39, 800.1, 800.11; 364/DIG. 1

[56] References Cited

U.S. PATENT DOCUMENTS

| | | | |
|---|---|---|---|
| 4,020,469 | 4/1977 | Manning | 326/40 |
| 4,700,187 | 10/1987 | Furtek | 340/825.8 |
| 4,736,333 | 4/1988 | Mead et al. | 364/736.01 |
| 4,847,612 | 7/1989 | Kaplinsky | 340/825.8 |
| 4,870,302 | 9/1989 | Freeman | 326/41 |
| 4,918,440 | 4/1990 | Furtek | 340/825.8 |
| 4,935,734 | 6/1990 | Austin | 340/825.8 |
| 4,992,680 | 2/1991 | Benedeti et al. | 307/465 |
| 5,144,166 | 9/1992 | Camarota et al. | 326/41 |
| 5,204,556 | 4/1993 | Shankar | 326/41 |
| 5,208,491 | 5/1993 | Ebeling et al. | 326/41 |
| 5,221,865 | 6/1993 | Phillips et al. | 326/86 |
| 5,243,238 | 9/1993 | Kean | 326/41 |
| 5,260,610 | 11/1993 | Pedersen et al. | 326/41 |
| 5,296,759 | 3/1994 | Sutherland et al. | 326/47 |
| 5,298,805 | 3/1994 | Garverick et al. | 326/37 |

(List continued on next page.)

FOREIGN PATENT DOCUMENTS

| | | |
|---|---|---|
| 0415542 | 3/1991 | European Pat. Off. |
| 0630115 | 6/1994 | European Pat. Off. |
| 2180382 | 3/1987 | United Kingdom. |
| 9208286 | 5/1992 | WIPO. |
| 9410754 | 5/1994 | WIPO. |
| 9504404 | 2/1995 | WIPO. |
| 9605964 | 4/1996 | WIPO. |

OTHER PUBLICATIONS

Devadas, "Boolean Decomposition of Programmable Logic Arrays", IEEE 1988, pp. 2.5.1–2.5.5.

(List continued on next page.)

*Primary Examiner*—Alyssa H. Bowler
*Assistant Examiner*—Dzung C. Nguyen
*Attorney, Agent, or Firm*—Blakely, Sokoloff, Taylor & Zafman LLP

[57] ABSTRACT

A programmable logic device which incorporates an innovative routing hierarchy consisting of the multiple levels of routing lines, connector tab networks and turn matrices, enables an innovative, space saving floor plan to be utilized in an integrated circuit implementation, and is particularly efficient when an SRAM is used as the configuration bit This floor plan is a scalable block architecture in which each block connector tab networks of a 2×2 block grouping is arranged as a mirror image along the adjacent axis relative to each other. Furthermore, the bidirectional input/output lines are provided as the input/output means for each block are oriented only in two directions (instead of the typical north, south, east and west directions) such that the block connector tab networks for adjacent blocks face each other in orientation. This orientation and arrangement permits blocks to share routing resources. In addition, this arrangement enables a 4×4 block grouping to be scalable. The innovative floor plan makes efficient use of die space with little layout dead space as the floor plan provides for a plurality of contiguous memory and passgate arrays (which provide the functionality of the bidirectional switches) with small regions of logic for CFGs and drivers of the block connector tab networks. Therefore, the gaps typically incurred due to a mixture of memory and logic are avoided. Intra-cluster routing lines and bi-directional routing lines are overlayed on different layers of the chip together with memory and passgate arrays to provide connections to higher level routing lines and connections between CFGs in the block.

7 Claims, 17 Drawing Sheets

U.S. PATENT DOCUMENTS

| | | | |
|---|---|---|---|
| 5,329,470 | 7/1994 | Sample et al. | 364/578 |
| 5,396,126 | 3/1995 | Britton et al. | 326/41 |
| 5,455,525 | 10/1995 | Ho et al. | 326/41 |
| 5,457,410 | 10/1995 | Ting | 326/39 |
| 5,469,003 | 11/1995 | Kean | 326/39 |
| 5,477,067 | 12/1995 | Isomura et al. | 257/211 |
| 5,550,782 | 8/1996 | Cliff et al. | 365/230.03 |
| 5,552,722 | 9/1996 | Kean | 326/41 |
| 5,572,148 | 11/1996 | Lytle et al. | 326/11 |
| 5,581,199 | 12/1996 | Pierce et al. | 326/41 |
| 5,581,767 | 12/1996 | Katsuki | 15/76 |

OTHER PUBLICATIONS

BuHoli et al., Dynamically Reconfigurable Devices Used to Implement a Self–timing High Performance PIP Controller, IEE 1989 pp. 107–112.

Liu et al., "Design of Large Embedded CMOS Pla's for Built–in Self–Test", IEEE 1988, pp. 50–53.

Vidal, "Implement Neural nets With Programmable Logic", IEEE 1988; pp. 1180–1190.

P. Wang et al., "A High Performance FPGA With Hierarchical Interconnection Structure," Institute of Electrical and Electronics Engineers, pp. 239–242 (May 30, 1994).

ATMEL Corporation, "Field Programmable Gate Arrays–AT600 Series," 1993.

Robert H. Krambeck, "ORCA: A High Performance, Easy to Use SRAM Based Architecture," Wescon '93 Record, pp. 310–320, Sep. 28–30, 1993.

Dave Bursky, "Fine–Grain FPGA Architecture Uses Four Levels of Configuration Hierarchy," Electronic Design, pp. 33–34, Oct. 1, 1993.

Altera Corporation, Data Sheet, "Flex EPF81188 12,000–Gate Programmable Logic Device," Sep. 1992, Ver. 1.

F. Zlotnick, P. Butler, W. Li, D. Tang, "A High Performance Fine–Grained Approach to SRAM Based FPGAs," Wescon '93 Record, pp. 321–326, Sep. 28–30, 1993.

Motorola Product Brief, "MPA10xx Field Programmable Gate Arrays," Sep. 27, 1993.

Xilinx, "The Programmable Gate Array Data Book," 1992.

P.T. Wang, K.N. Chen, Y.T. Lai, "A High Performance FPGA with Hierarchical Interconnection Structure," IEEE 1994 International Symposium on Circuits & Sys., pp. 239–242, May 30–Jun. 2, 1994.

R. Cliff et al., "A Dual Granularity and Globally Interconnected Architecture for a Programmable Logic Device," IEEE 1993 Custom Integrated Circuits Conf., pp. 7.3.1–7.3.5 (May 9–12 1993).

B. Britton et al., "Optimized Reconfigurable Cell Array Architecture for High–Performance Field Prgmble Gate Arrays," IEEE 1993 Custom Intgrtd Cir Conf., pp. 7.2.1–7.2.5 (May 9–12 1993).

Minnick R.C., "A Survey of Microcellular Research," *Journal of the Association for Computing Machinery,* vol. 14, No. 2, Apr. 1967, pp. 203–241.

Shoup, R.G., "Programmable Cellular Logic Arrays," Ph.D. dissertation, Carnegie–Mellon University, Pittsburgh, PA, Mar. 1970–Partial.

Spandorfer, L.M., "Synthesis of Logic Function on an Array of Integrated Circuits," UNIVAC, Division of Sperry Rand Corporation, Blue Bell, PA, Contract AF 19(628)2907, AFCRL 66–298, Project No. 4645, Task No. 464504, Nov. 30, 1965.

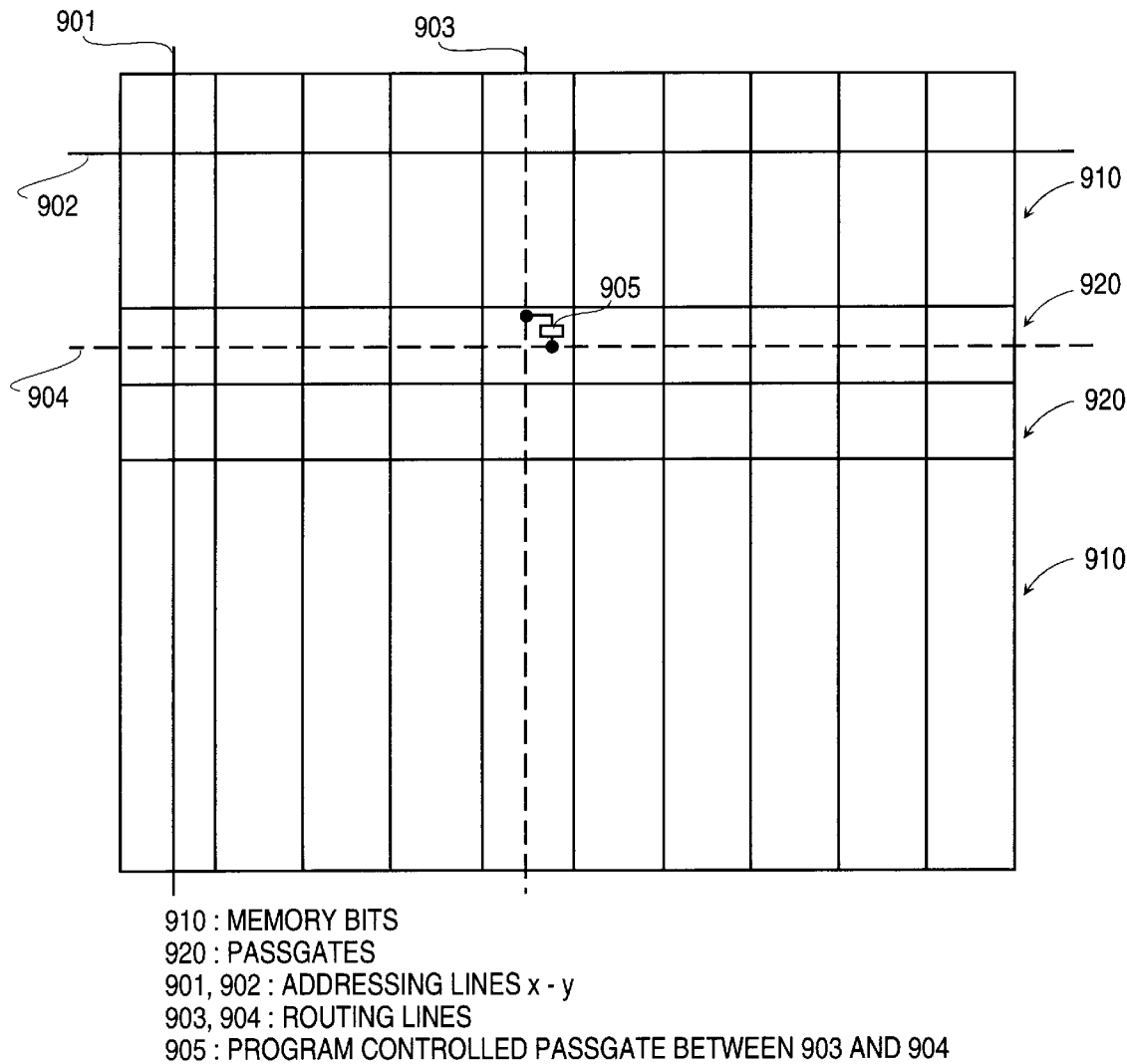
FIG. 9 EXAMPLE OF CONTIGUOUS MEMORY AND PASSGATE ARRAY LAYOUT ORGANIZATION

SCALABLE MULTIPLE LEVEL TAB ORIENTED INTERCONNECT ARCHITECTURE

BACKGROUND OF THE INVENTION

1. Field of the Invention

The present invention is directed to the field of programmable gate arrays. More particularly, the present invention is directed to a scalable multiple level connector tab network for increasing routability and improving speed of signals in a field programmable gate array.

2. Art Background

A field programmable gate array (FPGA) is a cost effective, high density off the shelf integrated logic circuit which can be programmed by the user to perform logic functions. Circuit designers define the desired logic functions and the FPGA is programmed to process the signals accordingly. Depending on logic density requirements and production volumes, FPGAs are superior alternatives in terms of cost and time to market. A typical FPGA essentially consists of an outer ring of I/O blocks surrounding an interior matrix of configurable function generator (CFG) logic blocks. The I/O blocks residing on the periphery of an FPGA are user programmable such that each I/O block can be programmed independently to be an input or an output and can also be tri-statable. Each logic block typically contains CFGs and storage registers. The CFGs are used to perform boolean functions on its input variables.

Interconnect resources occupy the channel between the rows and columns of the matrix of logic blocks and also between the logic blocks and I/O blocks. These interconnect resources provide flexibility to control the interconnection between two or more designated points on the chip. Usually a metal network of lines is oriented horizontally and vertically in rows and columns between the logic blocks. Programmable switches connect inputs and outputs of the logic blocks and I/O blocks to these metal lines. Cross point switches and interchanges at the intersection of the rows and columns are used to switch signals from one line to another. Often long lines are used to run the entire length and/or breadth or the chip in order to provide point to point connectivity. The functions of the I/O logic blocks and their respective interconnections are all programmable. Typically, these functions are controlled by a configuration program stored in an on-chip or separate memory.

As technology has become more and more sophisticated so has the functionality of FPGAs. The number of CFGs in an array has increased providing for more complex logic functions. It follows that the number of interconnection resources also has increased. Competing with the increased number of CFGs and interconnecting resources is the need to keep the chip as small as possible. One way to minimize the amount of real estate on the chip required is to minimize the routing resources while maintaining a certain level of interconnectivity. Therefore, it can be seen that as the functionality implemented on the chip increases, the interconnection resources required to connect a large number of signals can be quickly exhausted. As a consequence, most CFGs are either left unused due to inaccessibility or the CFGs are used simply to interconnect wires instead of performing certain logic functions. This can result in unnecessarily long routing delays and low logic utilization. The alternative is to provide more routing resources which can increase the chip die size dramatically.

SUMMARY OF THE INVENTION

An improved field programmable gate array (FPGA) is provided which includes tab network connectors for interfacing groups of logic cells with lower levels of interconnect and for interfacing lower levels of interconnect with higher levels of interconnect. In one embodiment, the connector is used to interface a group of elements or configurable function generators (CFGs), including storage elements, to certain levels of a hierarchical routing network. Each group or cluster of a logic block is formed of multiple CFGs programmably coupled to a set of bidirectional input/output lines. In the present embodiment an innovative cluster architecture is utilized which provides fine granularity without a significant increase in logic elements. The bidirectional input/output line is coupled to the connector. The connector includes a connector tab line coupled to the bidirectional input/output line through a programmable switch. The connector tab line is also coupled to the connector and bidirectional input/output line of an adjacent block. Frequently, signal routings occur between adjacent blocks, and in the prior art valuable routing lines which interconnect to higher levels of the routing hierarchy were used. In the improved FPGA of the present invention, a signal from a logic block can be directly routed to an adjacent logic block without utilizing the network of routing lines. This frees up the valuable routing lines to perform longer, non-adjacent block routings, and therefore the space required for non adjacent routing can be optimized. An additional, significant advantage is the minimizing of blockage caused by signal routings as each bidirectional input/output line is selectively coupled through two block connector tab networks to the routing hierarchy.

Also coupled to the bidirectional input/output line is a plurality of bidirectional switches that are programmable to permit a signal originating from the bidirectional input/output line to couple to one or more of a plurality of levels of hierarchical routing lines. A first programmable driver and second programmable driver are programmably coupled between the bidirectional input/output line and the plurality of switches. The first driver drives the signal received from the logic cells via the bidirectional input/output line out to one or more routing lines of the hierarchy of routing lines through determined programmable switches. The second driver takes a signal received from a routing line of the hierarchy of routing lines through a programmable switch to the bidirectional input/output line. Thus, a flexible, programmable connector is provided. Furthermore, the connector can be programmed to provide a "fan out" capability in which the connector drives multiple routing lines without incurring significant additional signal delay and without using multiple tab connector networks.

In another embodiment, the tab connector network can also be used to route a lower level routing line to a higher level routing line. This is particularly desirable in order to meet the needs for driving a signal along longer routing lines without requiring all signal drivers be sufficiently large to drive a signal along the longest routing line. In particular, routing tabs lines are provided that span distances equivalent to a third level of the routing hierarchy. A tab network is coupled to each routing tab line to programmably connect each block through the tab line to one of a plurality of higher level routing lines. The connector includes programmable bidirectional drivers to drive the signal along the longer higher level routing lines of the routing hierarchy.

These connector networks enable a flexible routing scheme to be implemented in which the routing lines at each level are divided into sets. For example, one set can be accessible by a first set of logic elements or CFGs and a second set accessible by a second set of logic elements or CFGs. The first set of routing lines are accessible to the second set of logic elements or CFGs via the corresponding connector networks for the second set of logic elements or CFGs. Similarly, the second set of logic elements or CFGs can access the first set of routing lines via the connector networks for the first set of logic elements or CFGs. It follows that the first set of CFGs and second set of CFGs can access both sets of routing lines thereby minimizing the likelihood of routing blockage of the signal.

Furthermore, a turn matrix is preferably included to cause the signal located on one routing line to transfer to a routing line in a different orientation. For example, a turn element of a turn matrix enables the signal to transfer between a horizontal and vertical routing line. As turn matrices require a significant amount of space on the chip, the connector networks can be utilized to provide sufficient connectivity, especially for the most commonly occurred two segments diagonal connect while minimizes the real estate for turn matrices. In particular, the connector networks enable the device to implement partial turn matrices, wherein up to half the number of turn elements are eliminated to save space on the chip.

In addition, this innovative routing hierarchy consisting of the multiple levels of. routing lines, connector tab networks and turn matrices, permits an innovative, space saving floor plan to be utilized in an integrated circuit implementation, and is particularly efficient when SRAM is used as the configuration bits. This floor plan is a scalable block architecture in which each block connector tab networks of a 2×2 block grouping is arranged as a mirror image along the adjacent axis relative to each other. Furthermore, the bidirectional input/output lines provided as the input/output means for each block are oriented only in two directions (instead of the typical north, south, east and west directions) such that the block connector tab networks for adjacent blocks face each other in orientation. This orientation and arrangement permits blocks to share routing resources. This reduces the routing segments requirement. In addition, this arrangement enables either a 2×2 block or a 4×4 block grouping to be scalable.

The innovative floor plan also makes efficient use of die space with little layout dead space as the floor plan provides for a plurality of contiguous memory and passgate arrays (which provide the functionality of the bidirectional switches) with small regions of logic for CFGs and drivers of the block connector tab networks. Therefore, the gaps typically incurred due to a mixture of memory and logic are avoided. Intra-cluster routing lines and bidirectional routing lines are intermixed and overlayed on different layers of the chip together with memory and passgate arrays to provide connections to higher level routing lines and connections between CFGs in the block.

BRIEF DESCRIPTION OF THE DRAWINGS

The object, features, and advantages of the present invention will be apparent from the following detailed description in which:

FIG. 9 illustrates an example of contiguous memory and passgate array.

DETAILED DESCRIPTION

An innovative connector tab network, interconnect architecture and layout floor plan for programmable logic circuits such as field programmable gate arrays (FPGAs) is described. In the following description for purposes of explanation numerous specific details are set forth, such as combinatorial logic cell or configurable function generator (CFG) configurations, number of CFGs, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention. It should also be noted that the present invention describes an embodiment which utilizes static random access memory (SRAM) to control the state of bidirectional switches utilized. However the present invention pertains to a variety of processes, including, but not limited to, SRAM, dynamic random access memory (DRAM), fuse/antifuse, erasable programmable read-only memory (EPROM), electrically erasable programmable read-only memory (EEPROM) and ferroelectric processes. The concept of the connector tab networks utilized in the routing hierarchy as interface points and as bidirectional drivers, can be applied in deep submicron masked gate arrays where judicious placing of such drivers is critical.

Figure 1:
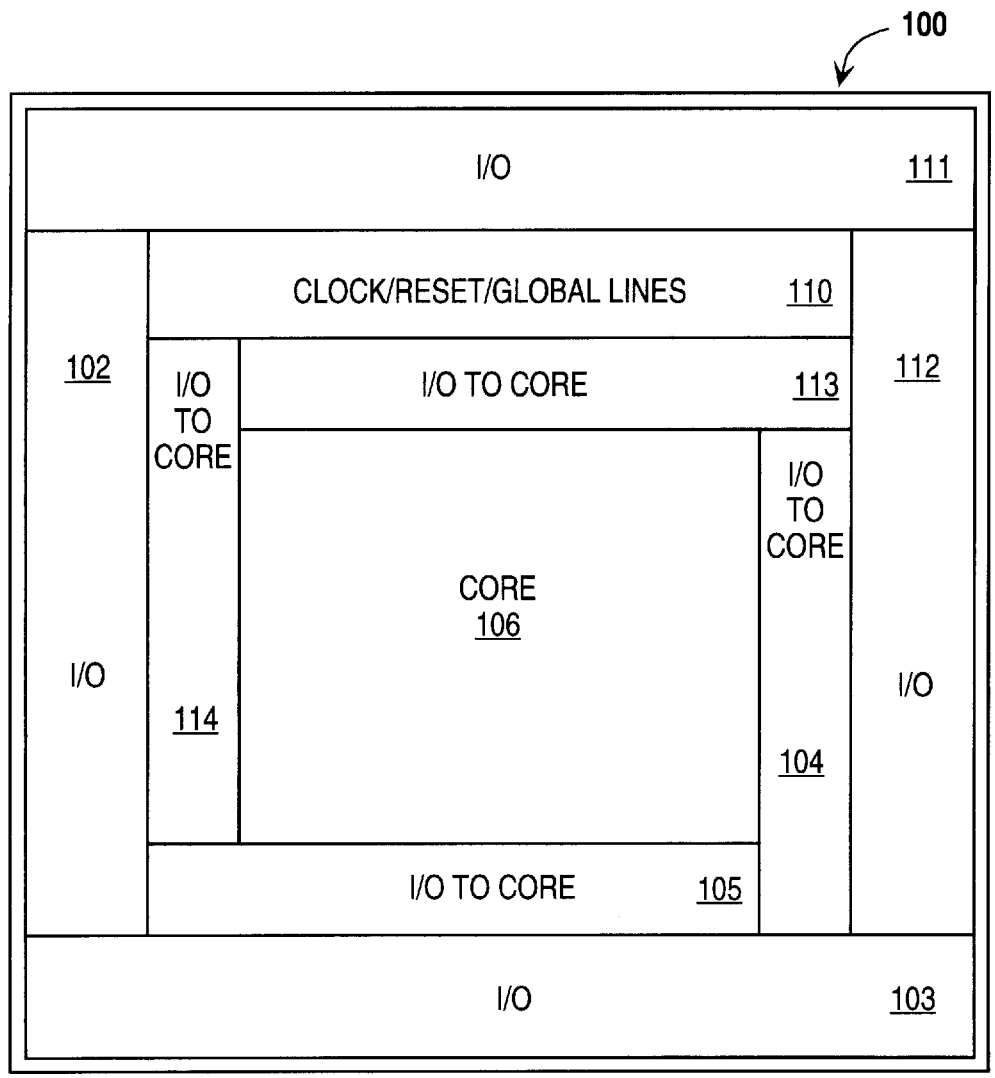
FIG. 1 is a block diagram of a field programmable gate array logic upon which the present invention may be practiced.

FIG. 1 is a block diagram illustration of an exemplary FPGA upon which the present invention may be practiced. The array 100 comprises I/O logic blocks 102, 103, 111, and 112, which provide an interface between external pins of the package of the FPGA and internal user logic, either directly or through the I/O logic blocks to the core interface blocks 104, 105, 113, and 114. The four interface blocks 104, 105, 113, and 114 provide decoupling between the core 106 and I/O logic blocks 102, 103, 111, and 112.

Core 106 includes the logic and interconnect hierarchy including the connector tab networks described herein in accordance with the teachings of the present invention. As will be described subsequently, this innovative interconnect hierarchy can be utilized to generate a floor plan that enables a significant savings on die size. Thus, as the interconnect density increases, the die size increases at a significantly slower rate. The core includes programming for the CFGs as well as control logic. In the embodiment described herein, SRAM technology is utilized. However, fuse or antifuse, EEPROM/ferroelectric or similar technology may be used. A separate clock/reset logic 110 is used to provide clock and resets lines on a group basis in order to minimize skewing.

Figure 2A:
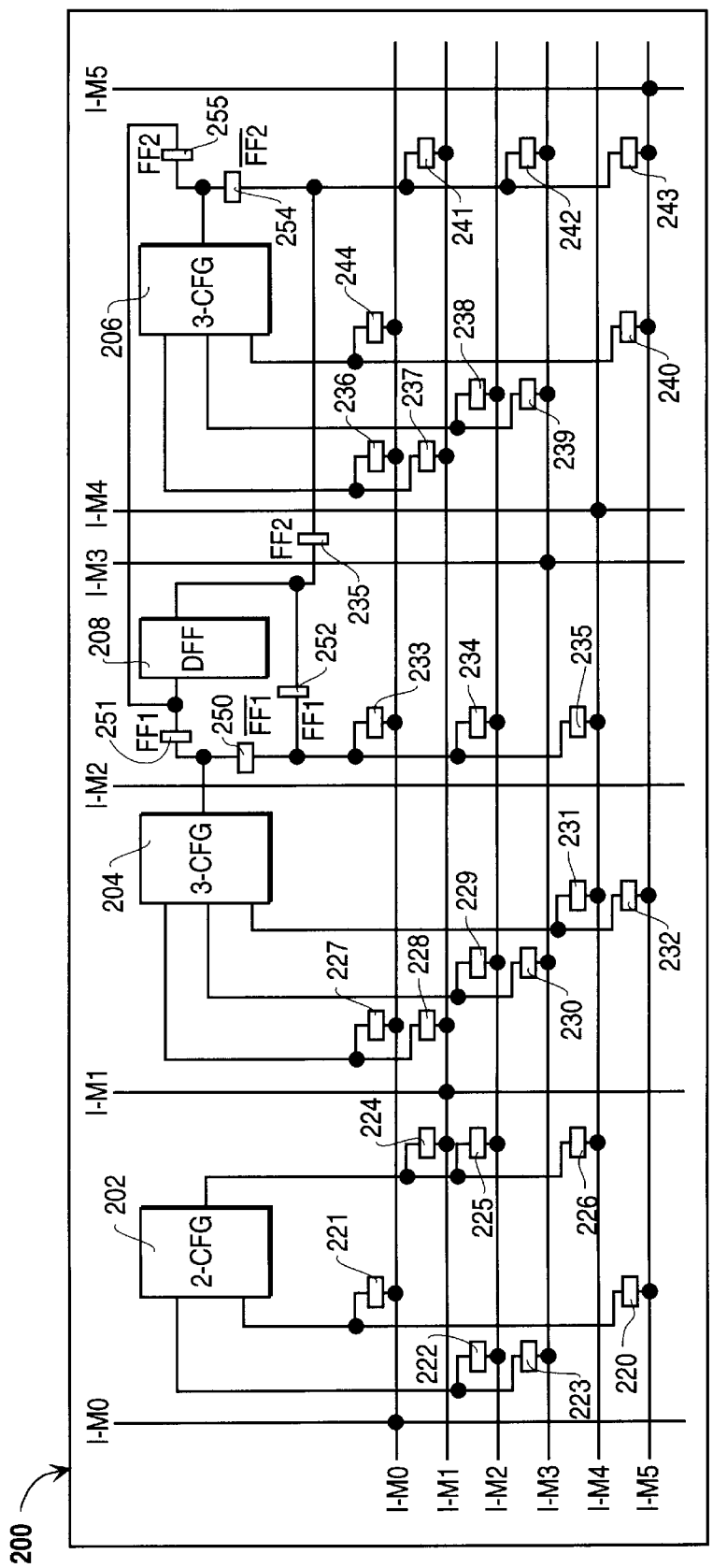
FIG. 2A illustrates one embodiment of a logic cluster.

The present embodiment provides CFGs in groups called clusters. FIG. 2A is an example of a logic cluster. It is contemplated that the logic cluster illustrated by FIG. 2A is illustrative and logic cluster can be formed of other elements such as logic gates and flip-flops. Referring to FIG. 2A, the logic cluster 200 is formed of four elements. These elements include one 2 input CFG 202, two three input CFGs 204, 206 and D flip-flop 208. CFG 202 can also be a three input CFG. The CFGs 202, 204, 206 are programmable combinatorial logic that provide a predetermined output based using two input values (for CFG 202) or three input values (for CFGs 204, 206). The CFGs are programmed with values to provide output representative of a desired logic function. The D flip flop 208 functions as a temporary storage element such as a register.

This combination of one two input, one output CFG, two three input one output CFGs and a D flip flop enable a variety of logic and arithmetic functions to be performed. For example, the elements can be programmed to perform such functions as comparator functions or accumulator functions. It should be noted that this combination of elements provides a fine granularity without the addition of redundant elements which add to the die size and speed of processing. Furthermore, the combination of elements also maximizes usage of elements thereby maximizing usage of die size space. The fine granularity characteristic resulting in more output points that can be tapped is a desirable characteristic as often an intermediate signal generated by a particular combination of elements is needed.

In addition, the local interconnect within the cluster is structured to enable signals to be processed with minimum delays. The cluster elements, 202, 204, 206, 208, are connected through interconnection lines I-M0 through I-M5 (referred to herein collectively as I-Matrix lines) which are oriented horizontally and vertically through the logic cluster. These intraconnections of a cluster are programmable through switches, for example switches 220–244. Intraconnections lines I-M0 to I-M5 and switches 220–244 form what is referred to herein as the I-Matrix. The I-Matrix provides connectability among the elements 202, 204, 206, 208 to at least one other element of the cluster. For example, the output of the CFG 202 can be connected to the input of CFG 204 by enabling switches 224 and 228.

To insure minimum signal delays during processing, separate, direct connections are provided between the D flip flop 208 and the three input CFGs 204, 206. Continuing reference to FIG. 2A, switches 250–255 and connected lines provide such connections. It has been determined that the input and output of the three input CFGs 204, 206 often perform programmed functions in conjunction with the register 208. For example the three input CFGs can be utilized with the register to provide a one bit multiplexing function.

The bidirectional switches 250–255 can be programmed a variety of ways to route the signal to achieve a specific function. For example, a signal output by CFG 204 can drive D flip-flop 208 by enabling switch 251. Alternately, the signal may be driven onto the I-Matrix by enabling switch 250. Similarly, the output of CFG 206 can drive the input of the D flip-flop 208 by enabling switch 255. Other routing paths by selectively enabling switches are also possible. Furthermore, the output of the CFG 202 can drive the D flip-flop 208 by an indirect connection through the I-Matrix. Thus, extreme flexibility is achieved.

The routing of the output signal of the D flip-flop is also programmable through switches 252 and 253. By selectively enabling switches 252 or 253 and selective switches of the I-Matrix, the output signal can be routed to any one of the elements of the cluster or of other clusters. The signal output is selectively routed through the switches 233–235 adjacent to the CFG 204 or to switches 241, 242 and 243 adjacent to CFG 206. Die savings are achieved without decreasing the level of usage of elements in the device.

Figure 2B:
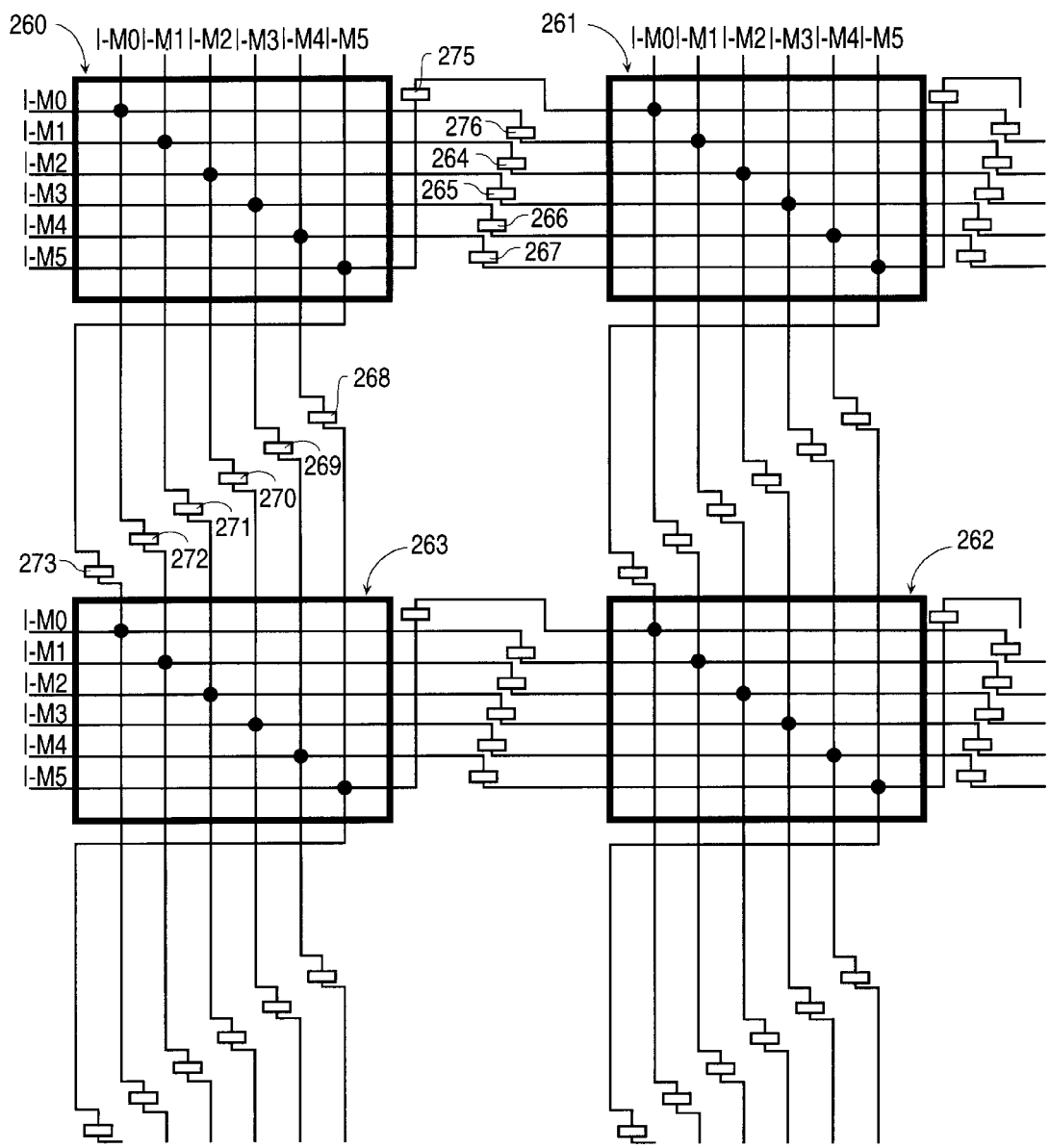
FIG. 2B illustrates one embodiment of local interconnect between logic clusters.

Each logic cluster is connectable to the other logic clusters inside the logic block through switches extending the I-matrix between neighboring clusters. FIG. 2B illustrates I-matrix interconnection lines I-M0 to I-M5 of a first logic cluster 260 selectively connected to the I-Matrix lines of adjacent logic clusters 261 and 263, respectively through switches 264, 265, 266, 267, 275 and 276.

The flexibility herein described is partially achieved through the numerous bidirectional switches used. It was also noted previously that the switches can be implemented a variety of ways. For example, the switches can be implemented as fusible links which are programmed by blowing the fuse to open or short the switch. Alternately, the switch is a passgate controlled by a bit in an SRAM array. The state of the bits in the array dictate whether a corresponding passgates are open or closed. Although the SRAM implementation is often preferable because of programming ease, the die space required is significantly more. Therefore, one technique to minimize the die size is to use a fewer number of switches to provide interconnection between individual routing lines of the routing hierarchy described below. This is referred to herein as partial coverage structure. For example, in FIG. 2A switches 221, 220 connect I-M0 and I-M5 to the inputs of CFG 202. As will be described below with respect to the present embodiment, partial turn matrices are used to eliminate up to 50% of the switches typically used in a turn matrix.

To allow an efficient implementation of a carry chain as well as other applications, staggered or barrel connections between clusters is used to increased connectivity. FIG. 2B illustrates the extensions of the I-Matrix within a logic cluster to neighboring clusters. For example, switch 275 connects I-M5 of cluster 260 to I-M0 of cluster 261 and switch 276 connects I-M1 of cluster 260 to I-M2 of cluster 261.

A plurality of interconnected logic clusters form a logic block. In the present embodiment each logic block consists of four logic clusters organized in a 2×2 array. Each logic block has a set of bidirectional routing lines to which all CFGs inside the logic clusters are programmably connected. The bidirectional routing lines provide the path for signals to travel into and out of the logic block to the routing lines of a hierarchical routing architecture having multiple lengths of interconnections at different levels of the hierarchy. It can also be seen that the block connectors can also provide connections among the CFGs of the logic clusters of the same block and adjacent blocks. Although the input and output of each element of each logic cluster of the logic block can be selectively connected to each block connector, to control the expansion on die size it is preferred that each input and output is selectively connected to a subset of block connectors. An example of such an embodiment is shown in FIG. 3B.

Figure 3A:
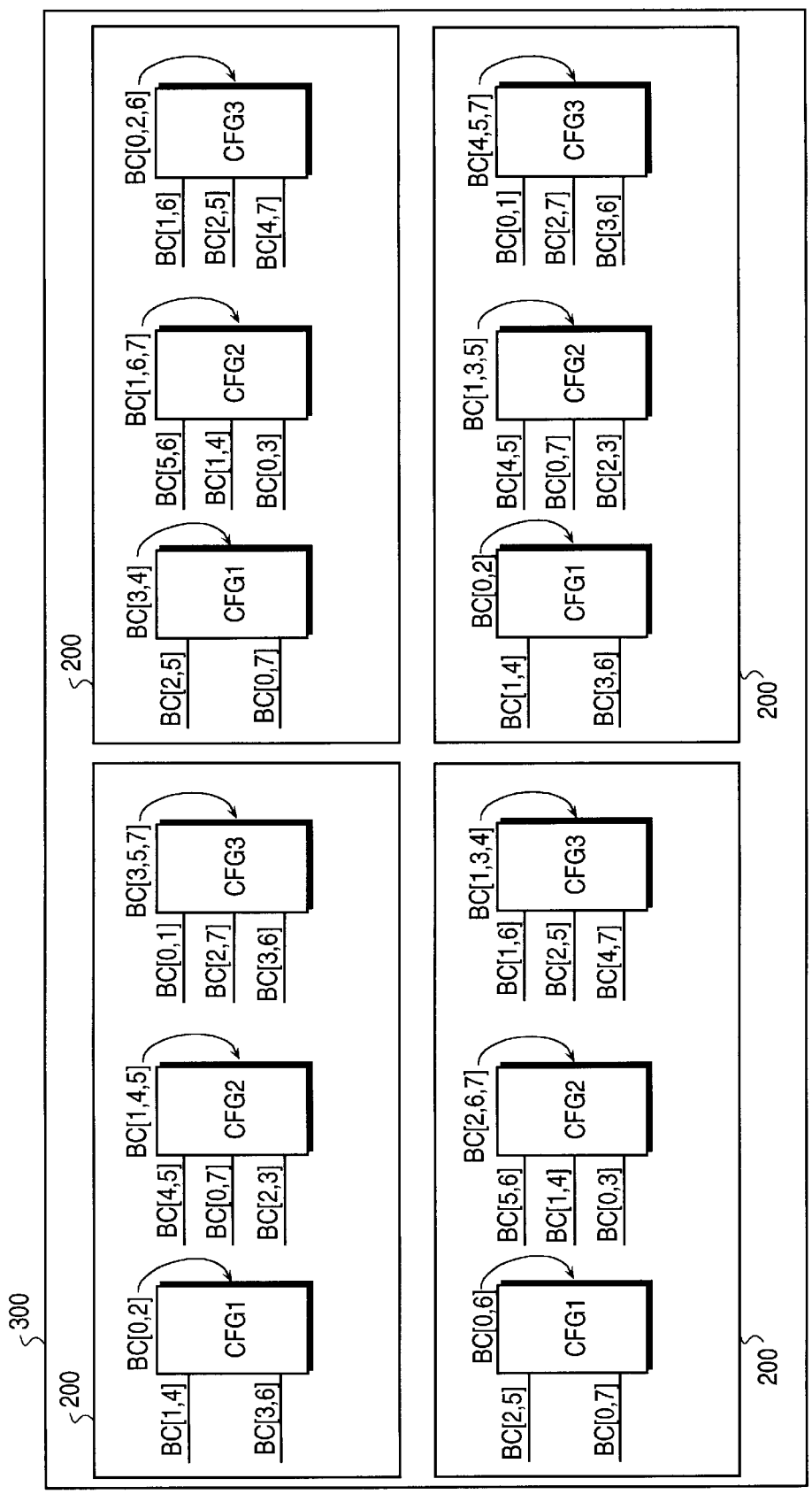
FIGS. 3A and 3B depict an example of a logic cluster with vertical block connectors.
Figure 3B:
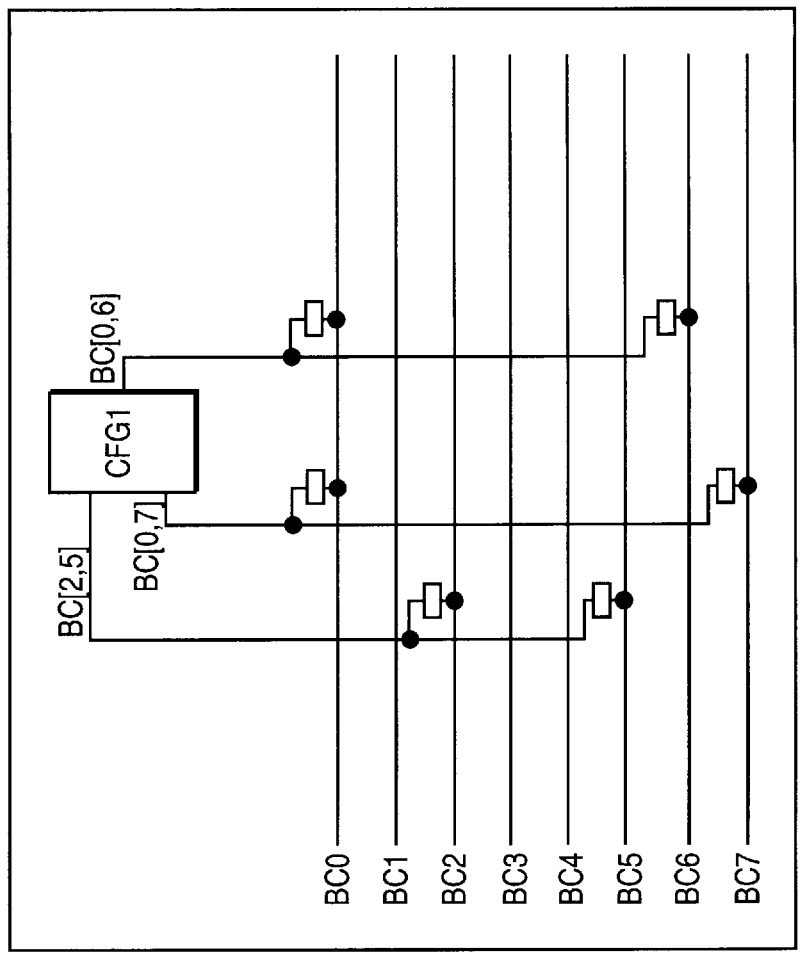
Figure 3B:
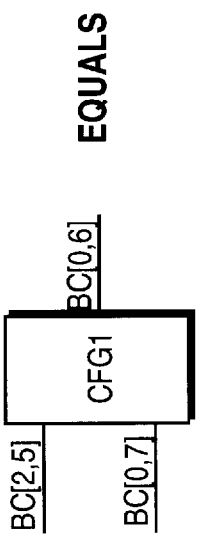

Referring to FIG. 3B, a symbolic representation of one embodiment of the connections to block connectors within a block 300 is shown. Each element of each cluster 200, e.g., CFG1, CFG2 and CFG3 is connected to two identified block connectors (BC) at the inputs. Two block connectors are identified as coupled to the output of the two input CFG1 and three block connectors are coupled to the output of the three input CFGs (CFG2, CFG3). The specific block connectors coupled to each elements are distributed among the elements of the block to maximize connectivity.

The block connectors provide the input and output mechanism for interconnecting to higher levels of connections of the routing hierarchy referred to as the multiple level architecture (MLA) routing network. The network consists of multiple levels of routing lines (e.g., MLA-1, MLA-2, MLA-3, etc.) organized in a hierarchy wherein the higher level routing lines are a multiple longer than the lower level routing lines. For example, MLA-2 routing lines are twice as long as MLA-1 routing lines and MLA-3 routing lines are twice as long as MLA-2 routing lines.

Figure 4A:
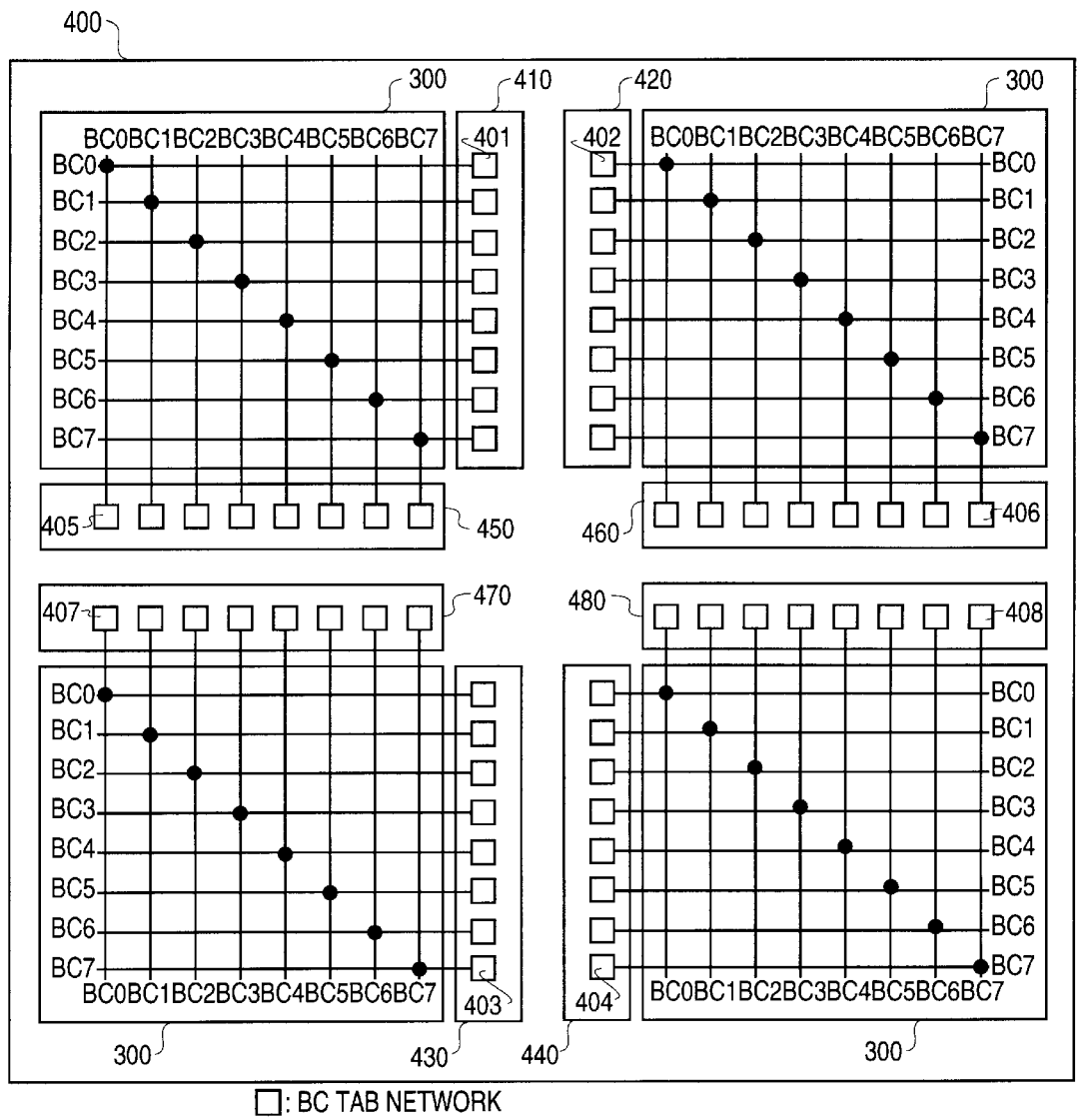
FIG. 4A illustrates the connection between block connectors and block connector tab networks which interface with higher level routing lines of the routing hierarchy.
Figure 4B:
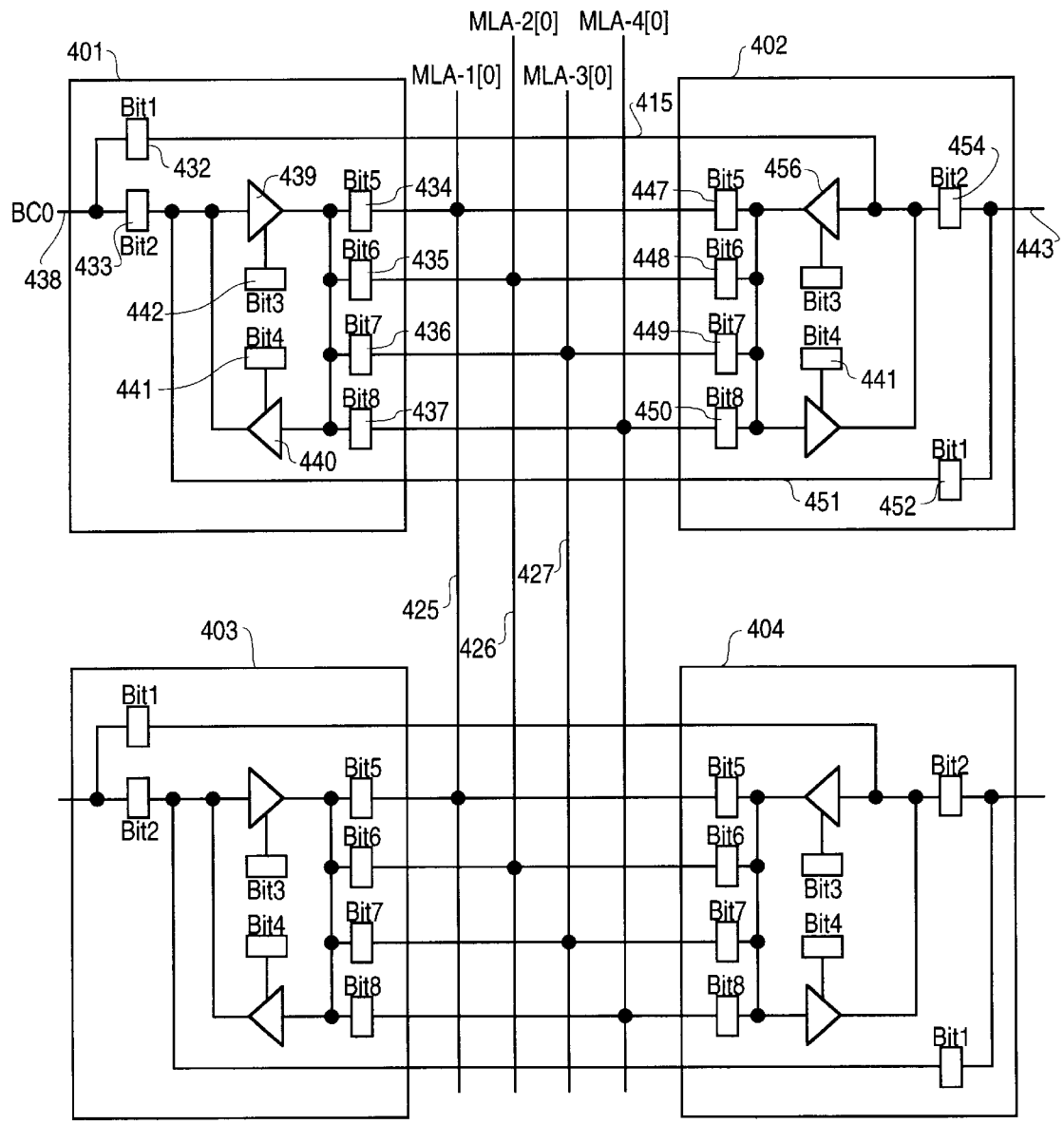
FIG. 4B shows exemplary horizontal block connector tab networks that programmably connect to vertical lines of multiple levels of the routing hierarchy.
Figure 4C:
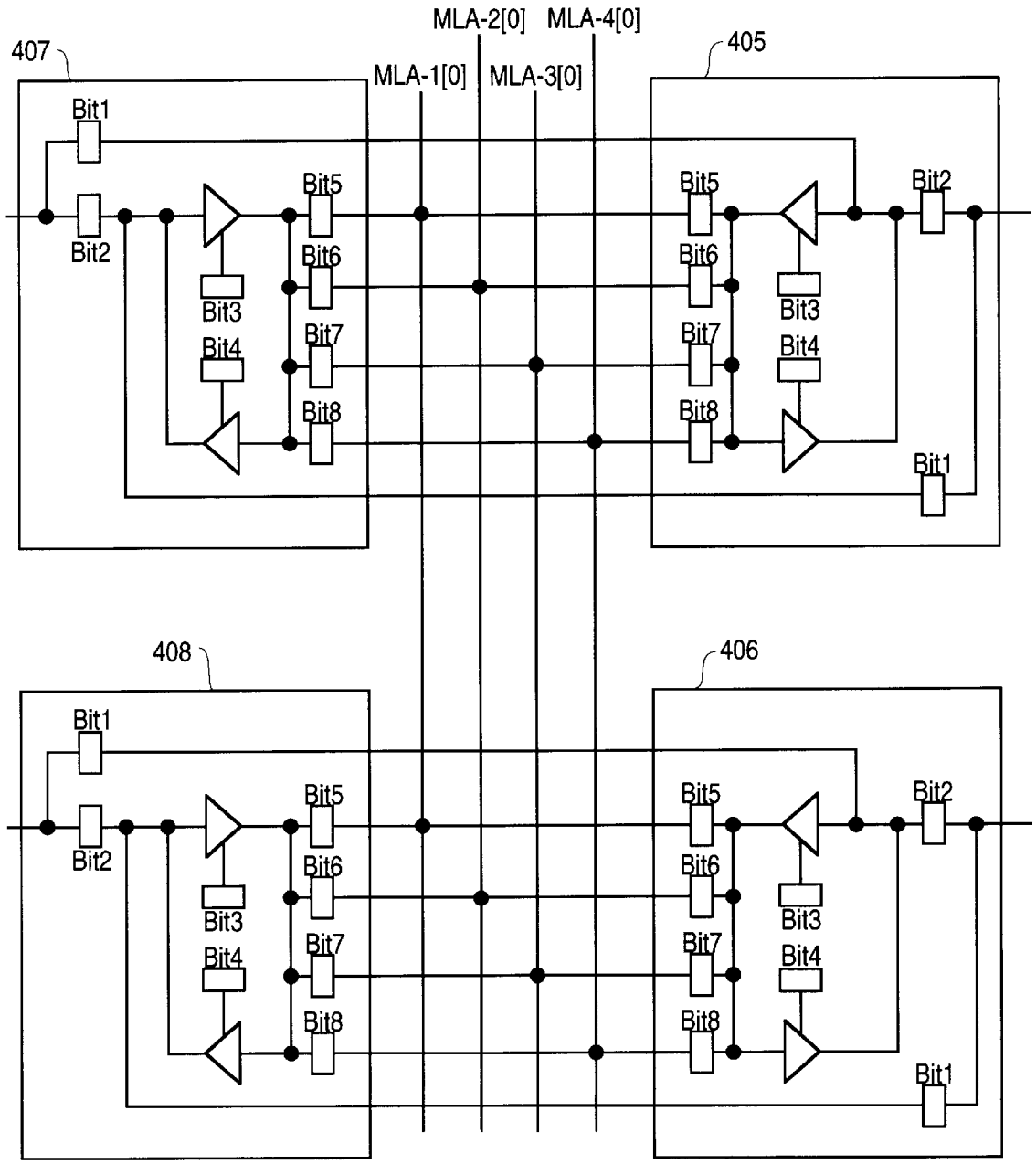
FIG. 4c shows exemplary vertical block connector tab networks that programmably connect to horizontal lines of multiple levels of the routing hierarchy.

An innovative block connector tab network is utilized to interface the block connectors (BC) to the MLA routing network and to adjacent block connectors of adjacent logic blocks. As is shown in FIG. 4A, a block connector tab network, for example, 401–408, is connected to each block connector line of each block 300. FIG. 4B illustrates one embodiment of a horizontal block connector tab network which connects to vertical MLA routing lines. FIG. 4C illustrates one embodiment of a vertical block connector tab network which connects to horizontal MLA routing lines.

In the embodiment shown in FIG. 4B, the block connector (BC) tab network 401 of a first logic block includes a plurality of programmable switches 432–437. These bidirectional switches enable the selective routing of signals to and from the logic block through BC line 438. Also included in the network 401 are two programmable drivers 439 and 440. In the present embodiment, these drivers 439, 440 are controlled by the state of the two bits 441, 442; however, it is readily apparent that one control bit can be used in place of the two control bits wherein the driver, e.g., driver 440 is active when the bit is in one state and the second driver, e.g., driver 439 is active when the bit is in the second state. In addition, it is readily apparent that BC tab networks can also be implemented to perform the functionality described herein using as single or multiple drivers in conjunction with other elements.

The BC tab connector network provides a simple but efficient way to route the signals to and from a logic block. Through programmable switch 432, the signal to or from the block through BC line 438 is programmably coupled to the BC tab network 402 of an adjacent logic block. In the present illustration the signal routed over BC line 438 through switch 432 can be routed to BC line 443 through switch 454. The same signal that comes across line 415 from BC line 438 through switch 432, can be selectively routed through driver 456 and to a selected MLA through one of the four switches 447–450. For example, the BC tab networks, e.g., BC tab 401 and 402, are interconnected to MLA-1, 2 and 3, which are labeled as 425, 426, and 427. Thus, in addition to providing a direct routing mechanism to adjacent logic blocks, the BC tab network provides an alternate path for routing a signal to MLAs through the tab connector network of an adjacent logic block. This minimizes the occurrence of blockage or inaccessible routing paths. For example, an alternate path 451, is provided through switch 452 and switch 433 to interconnect block connectors 438 and 443. Thus, it can be seen that extreme flexibility in routing, as well as efficiency in routing, can be achieved utilizing these BC tab networks. An additional advantage is signal speed; this architecture results in lightly loaded lines and therefore no signal speed penalty is realized even though routing flexibility is enhanced. In FIG. 4B, the BC tab network can be used to provide a signal fan out capability to connect to multiple MLA lines by setting the appropriate switches, e.g., 434, 435, 436, 437, without incurring signal speed penalties typically realized in a fan out arrangement.

Figure 5:
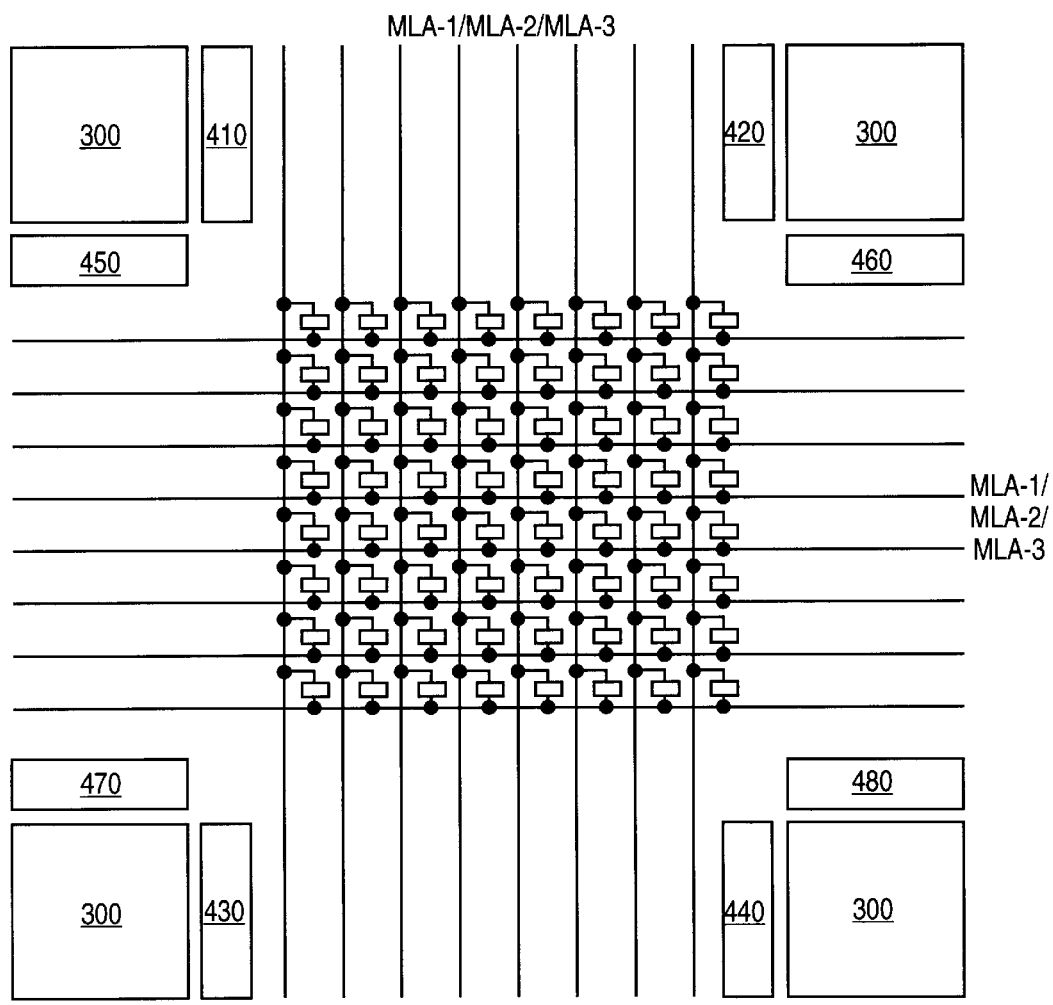
FIG. 5 is a simplified diagram illustrating a 2×2 logic block and the block connector tab networks that provide the interface to higher levels of the routing hierarchy in conjunction with the turn matrices.

In one embodiment such as illustrated in FIG. 5, each BC line is programmably connected through a BC tab network to an adjacent BC tab network and to the routing lines of the MLA network. This provides extreme flexibility in routing. The MLA routing network in the present embodiment is described having a plurality of levels of routing lines with a programmable switch matrix selectively coupling horizontal and vertical MLA lines to enhance connectivity. The level 1 MLA routing lines (MLA-1) provide interconnections between several sets of block connectors. Programmable switches are used to provide users with the capability of selecting the block connectors to be connected. Thus, a first logic block from one set of logic block groups is connectable to a second logic block belonging to the same group wherein a logic block group is a set of logic blocks. The switches within a logic block can, of course, be further programmed to route the signal within the logic block. The level 2 MLA routing lines (MLA-2) provide interconnections to various MLA-2 lines to affect access and connections of a block cluster, which consists of a 4×4 matrix of blocks in the present embodiment. Switches are provided to enable the user to program the desired connections. The span of the level 2 MLA lines is preferably a factor greater than the span of the MLA-1 lines. For example, the MLA-2 lines are preferably twice the span of an MLA-1 line.

As can be seen, additional levels of MLA routing lines can be implemented to provide programmable interconnections for larger numbers and groups of logic blocks, block clusters, block sectors (which is an 8×8 matrix of blocks), etc. Each additional level spans a distance a factor greater (such as a multiple of 2 greater) than the adjacent lower level. Thus, a multi-dimensional approach for implementing routing is provided. Signals are routed amongst the interconnections of a logic block. These signals are then accessed through block connectors and the corresponding block connector tab networks and routed according to the programmed switches. The block connector tab networks enable a programmable direct connection to higher levels of MLA routing lines, for example, MLA-2 and MLA-3 routing lines. Alternately, higher levels of routing lines of the hierarchy can be reached through the lower levels of the hierarchy through programmable switches located between levels of routing lines of the hierarchy.

Figure 6A:
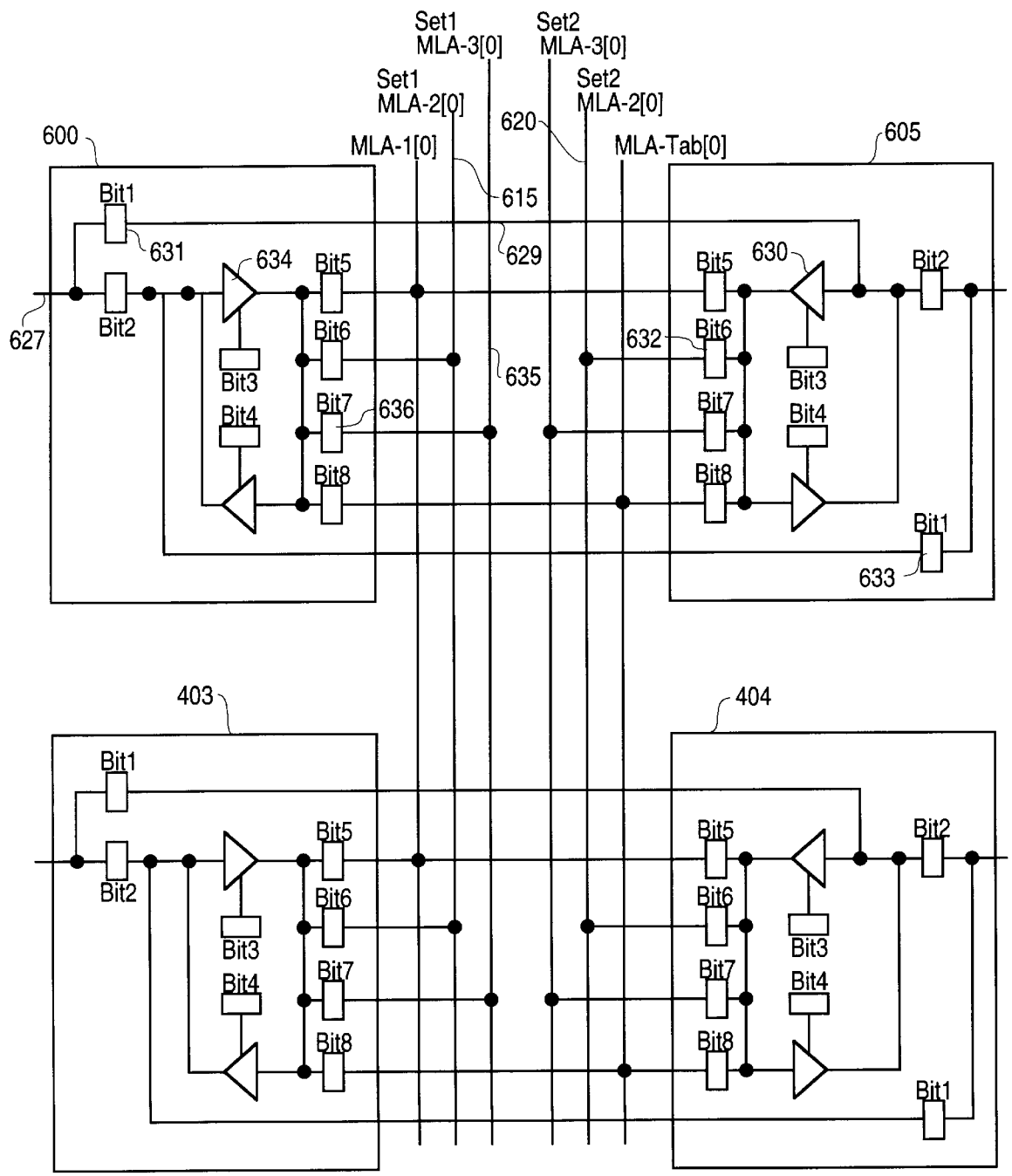
FIG. 6A and FIG. 6B illustrate an alternate embodiment in which the block connector tab networks are connected to subsets of routing lines of multiple levels of routing lines.
Figure 6B:
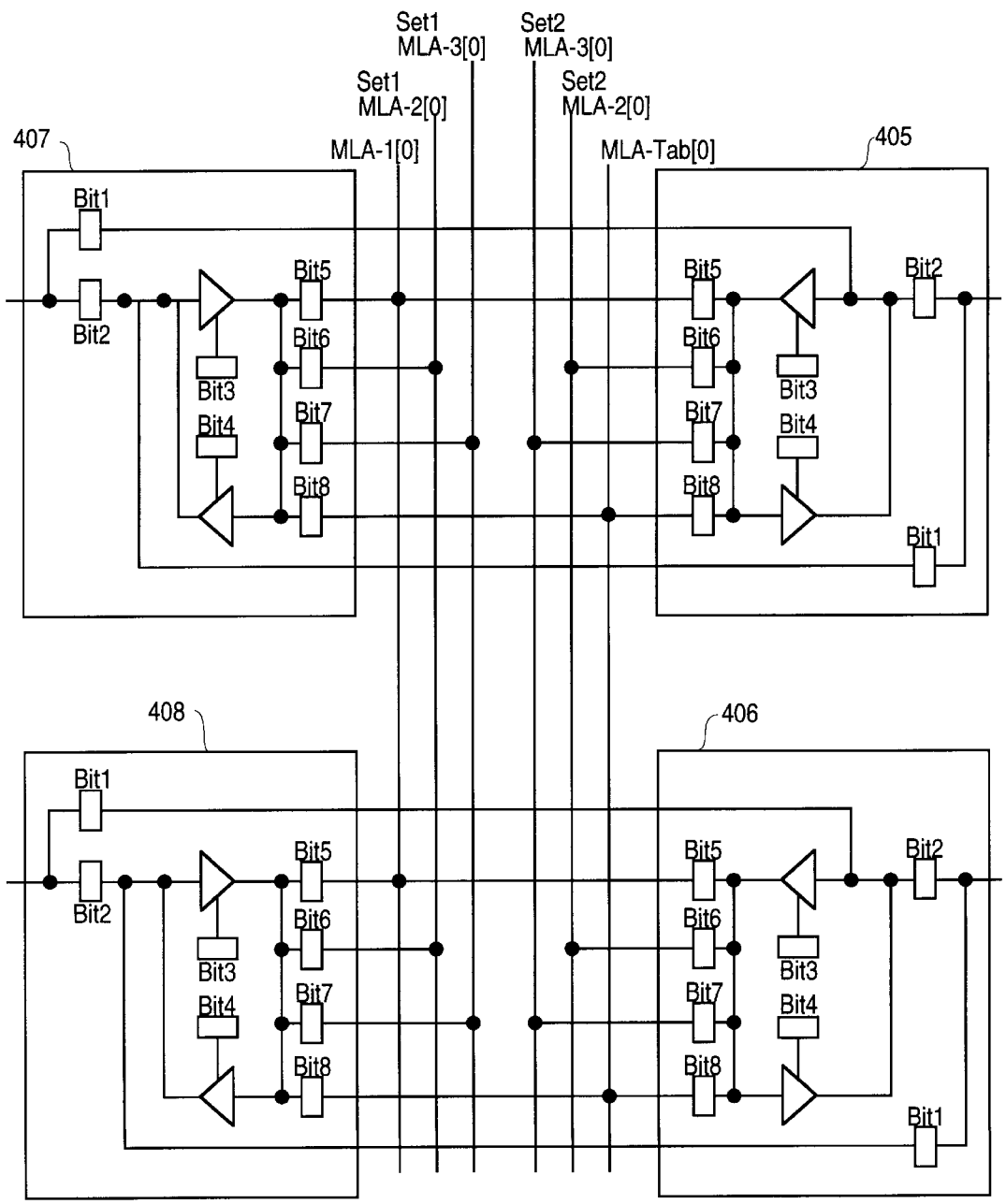

FIGS. 6A and 6B disclose an alternate embodiment in which each BC tab network is connected to a set of the routing lines of multiple levels of routing lines. An adjacent BC tab network is connected to another set. In the present invention the number of lines in each set is the same as the number of MLA lines of a level which is not divided into sets. The resultant effect is the doubling of the number of routing lines and hence increased connectivity. However, the sets can also include fewer or additional lines in order to achieve the desired level of connectivity.

Signals are programmably routable between BC tab networks to achieve the desired level of connectivity. For example, FIG. 6A illustrates adjacent horizontal BC tab networks 600, 605. BC network 600 is programmably connected to a first set of MLA-2 lines 615. Similarly, the adjacent BC tab network 605 is programmably connected to a second set of MLA-2 lines 620. If a signal, for example, originating on BC line 627, is to be routed to a signal line of MLA-2 coupled only to BC tab network 605, the signal can be routed from BC tab network 600 to BC tab network 605 through switch 631, through tab line 629, driver 630 and switch 632 to programmably connect to MLA-2 lines 620. Similarly, if a signal originating from a block connected to BC tab network 605 is to be routed to MLA-3 635, the signal is routed via BC tab network 600 through switch 633, driver 634, switch 636 to MLA-3 635. The BC tab network therefore functions to provide increased connectivity in a limited connectivity structure. The BC tab networks also enable the designer to minimize loading and maximize signal speed by selecting the best MLA lines to route a signal, whether or not the MLA is accessible through an adjacent BC tab connector network. In addition, loading is minimized. In particular, the BC tab connector network and a partial turn matrix reduces loading up to 50%, resulting in significant improvements of signal speed.

In the present embodiment, the first three levels of the routing hierarchy, MLA-1, MLA-2 and MLA-3, are used to interconnect a 8×8 block matrix, wherein each block is formed of four logic clusters. Each block is programmably connected to a MLA tab line via the BC tab connector network. Each MLA tab line is programmably connected to a MLA tab connector network which functions in a manner similar to the BC tab network to route signals to and from higher level routing lines.

As the number of CFGs on the chip increases, additional interconnect is needed. In the present architecture, it is desirable to add to the levels of the routing hierarchy to maintain routability of signals. At each higher level of the hierarchy, there is an increase in the length of the routing from the lower level routing lines. In order to drive longer signal routing lines, larger signal drivers are needed. To minimize the effect on die size, it is preferred to limit the number of signal drivers that drive the longer routing line characteristic in the higher levels of the routing hierarchy. In addition, it is preferable that the architecture be scalable to provide an effective design mechanism to accommodate increasing densities of logic circuits on a chip and the connectivity required and to minimize engineering efforts associated with large number of parts. Therefore, it has been found that after a first number of levels of the hierarchy, it is desirable to provide an MLA tab connector network to enable scalability, as well as to provide signal driving functions for the longer, higher levels of routing lines.

Figure 7A:
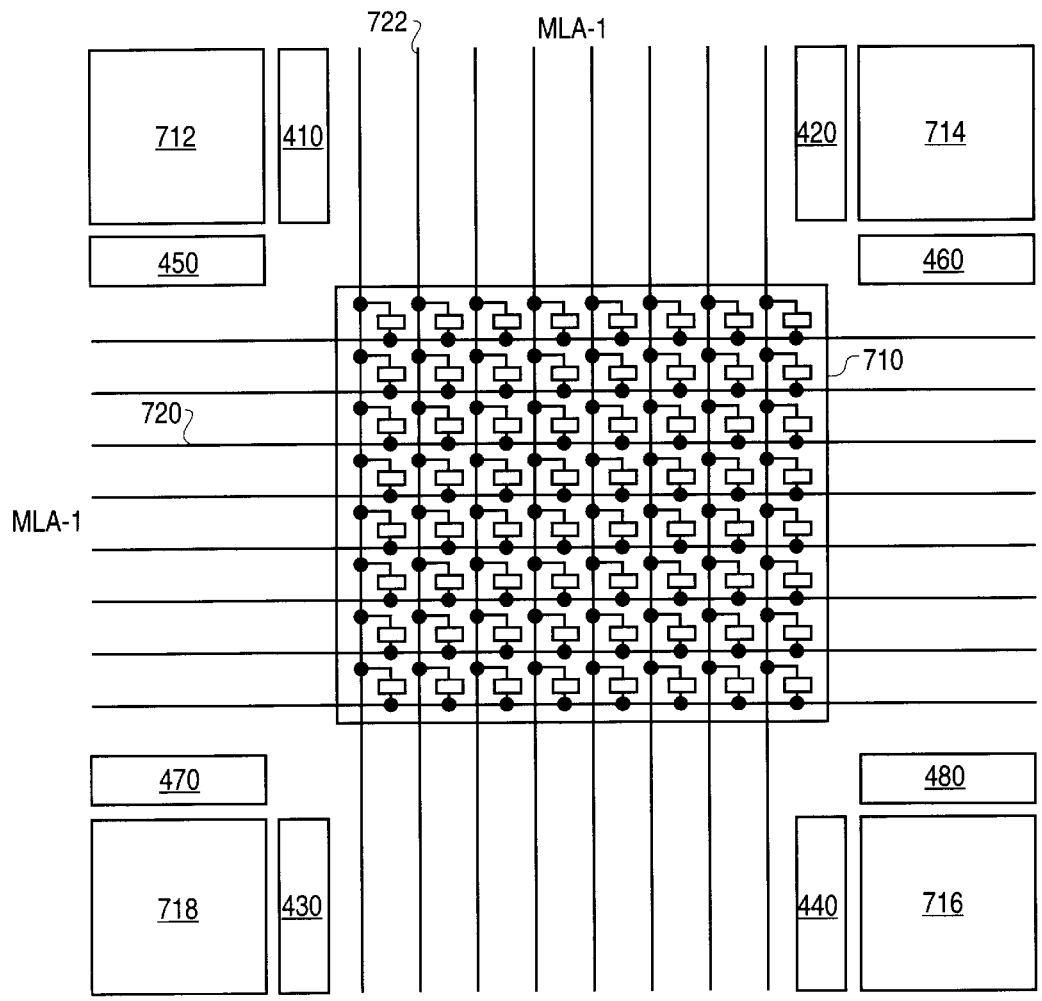
FIGS. 7A, 7B and 7C respectively are a simplified block diagrams of embodiments of a horizontal and vertical MLA turn network for a first level of routing lines, and partial turn networks for second and third levels of routing lines.

Programmable turn switches are preferably provided to connect selectively horizontal MLA lines and vertical MLA lines. This is illustrated in FIG. 7A. FIG. 7A shows a turn matrix which is a portion turn network 710 for eight lines of an MLA-1 interconnecting four logic blocks 712, 714, 716 and 718. The turn network 710 is controlled by a plurality of turn bits which control whether a particular intersection of a horizontal MLA line, e.g., line 720, and a vertical MLA line, e.g., 722, are connected such that the signal may be routed between the horizontal 720 and vertical 722 MLA line. FIG. 7A is representative of a turn matrix that is used to interconnect MLA-1 routing lines. This turn matrix 710 provides complete coverage, i.e., each horizontal MLA-1 line is programmably connected to each vertical MLA-1 line.

Figure 7B:
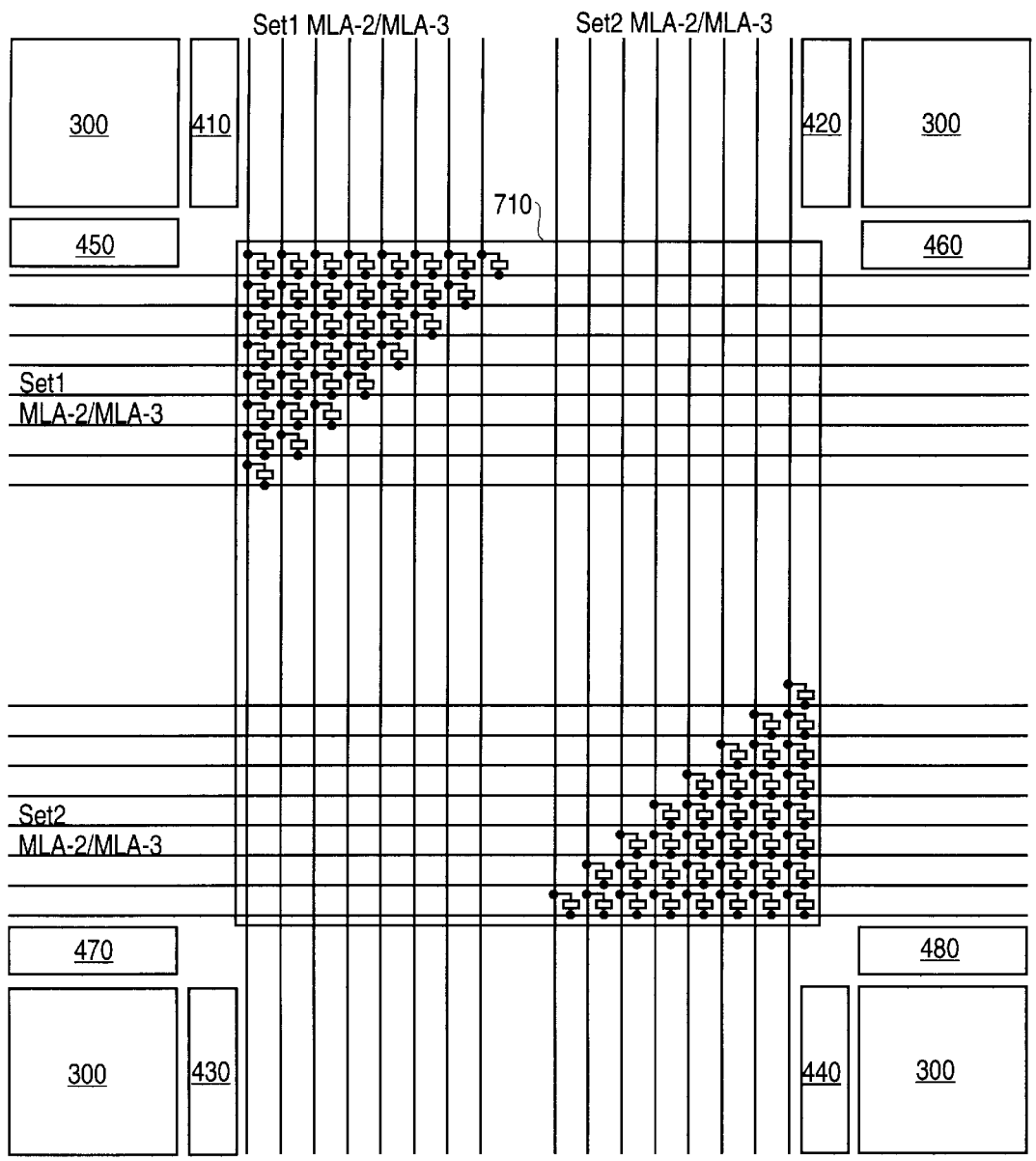

Complete turn matrices can also be utilized for the higher level MLA lines, e.g., MLA-2 and MLA-3. However, in the present embodiment the number of lines at each level has multiple sets of routing lines. To save on die space by decreasing the number of switches needed to form the turn matrix, partial turn matrices are used. FIG. 7B is illustrative of partial turn matrices of turn network 710 for MLA-2 and MLA-3 lines within a 2×2 matrix of logic blocks. As noted earlier, the die savings achieved by minimizing the size of the turn matrices more than offsets any decrease in connectivity. Furthermore, any decrease in connectivity is also offset by the capability of routing signals through the block connector tab networks 410, 420, 430, 440, 450, 460, 470, 480 to other routing lines in the MLA routing hierarchy as illustrated in FIG. 6A and FIG. 6B.

Figure 7C:
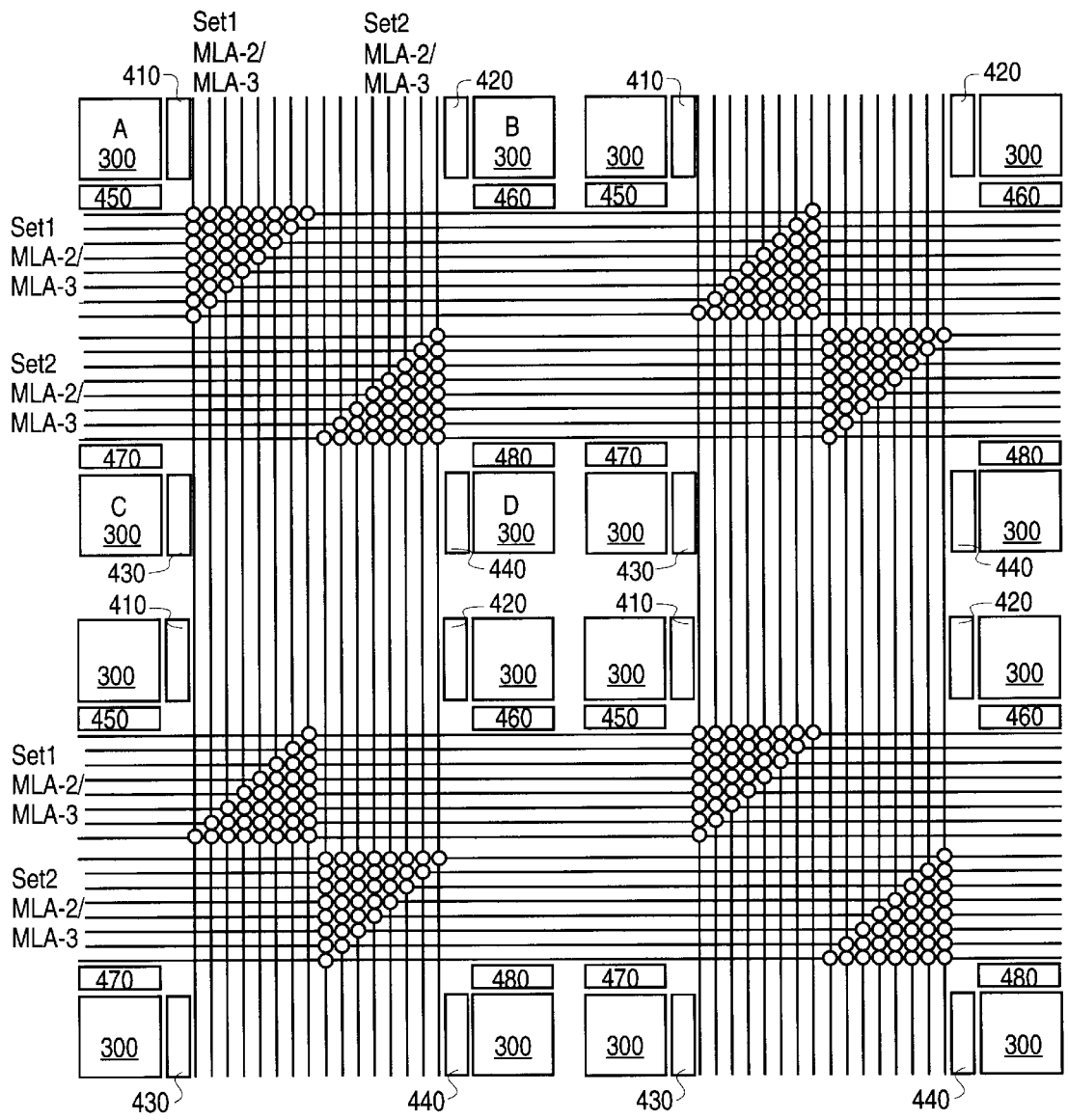

FIG. 7C provides an embodiment of the partial turn matrices utilized to interconnect MLA-2 and MLA-3 routing lines in a 4×4 matrix composed of 4 2×2 matrices of logic blocks. It should be noted that the location of the individual switches in the partial turn matrices are arranged to balance the load on each line. In particular, it is desirable that the same number of switches are located on each line to maintain a constant load on each line. In the present embodiment this is accomplished by alternating the mirror images of the partial turn matrices such as is shown in FIG. 7C.

This innovative routing hierarchy consisting of the routing lines, block connector tab networks and turn matrices, permits an innovative, space saving floor plan to be utilized on a semiconductor device. The benefits of the architecture and the innovative floor plan discussed herein can be seen particularly in an SRAM implementation. Extensive die savings is realized by grouping memory into large, contiguous blocks. This is quite different from prior art floor plans which integrate logic and memory resulting in significant wasted space, often referred to as layout dead space. In addition, this floor plan includes a scalable block architecture in which each block includes a plurality of contiguous memory and passgate arrays. Intra-cluster routing lines and bi-directional routing lines are overlayed on different layers over the memory and passgate arrays to provide connections to higher level routing lines and connections between CFGs in the block. Each memory and passgate array includes the SRAM and passgates to control the programmable switches described above. The floor plan of a single block is easily scalable to generate floor plans of multiple block structures. In the present embodiment, a 4×4 matrix of blocks including routing lines and turn matrices are scalable to larger matrices of blocks by simple replication and abutment of 4×4 matrices.

Figure 8A:
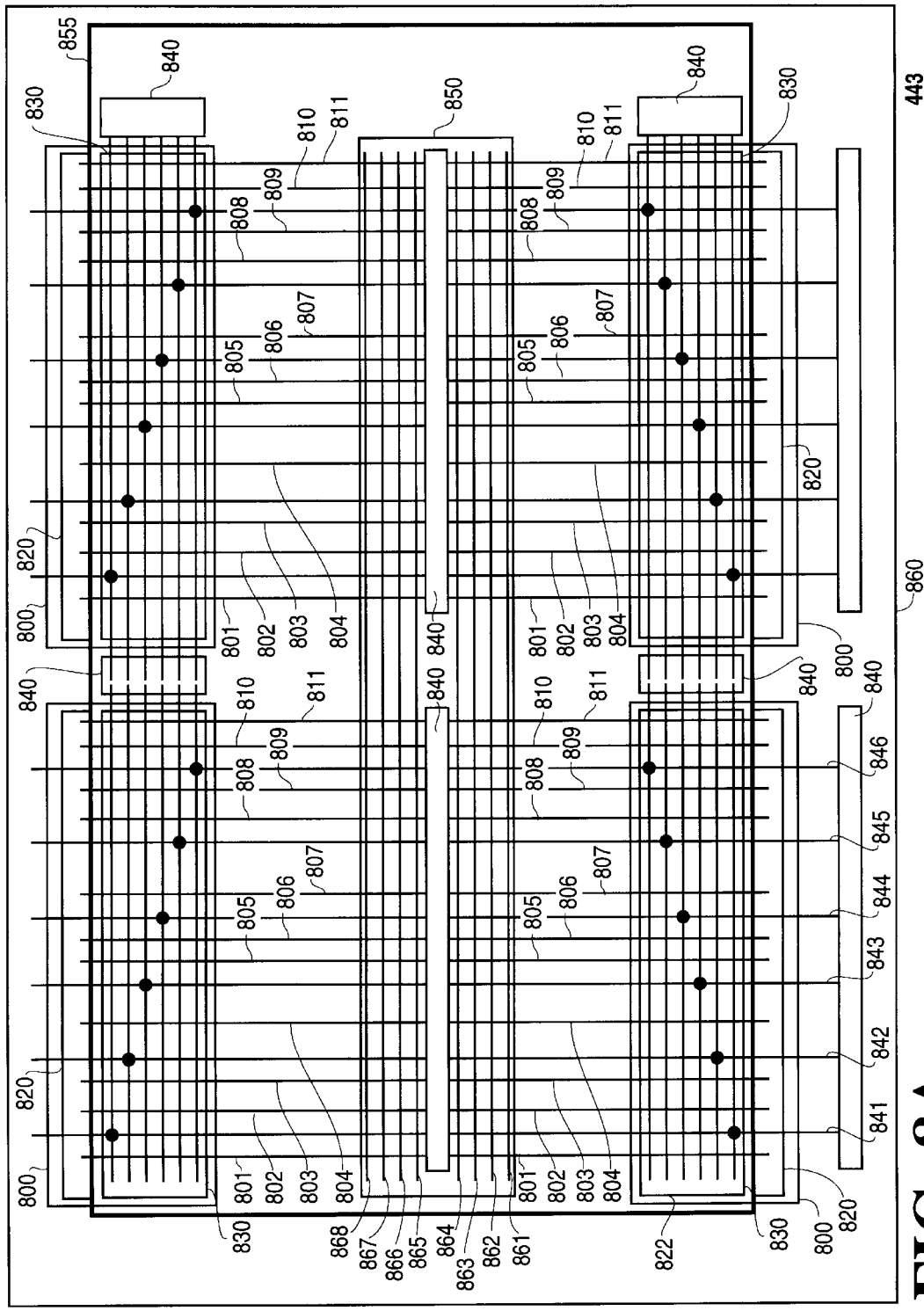
FIG. 8A is a simplified diagram illustrating a layout floor plan for a logic block.

The innovative floor plan will be described with reference to the embodiment shown in FIGS. 8A and 8B. One embodiment of the floor plan for a logic block is shown in FIG. 8A. Each logic cluster 800 includes the elements or the CFGs of the cluster 820 and the I-Matrix which is formed of the I-Matrix lines 841–846 and the memory and passgate array 830 which controls the selective connections between the I-Matrix lines and I/O lines 801–811 of the CFGs coupled to the elements of the cluster. I-Matrix extensions 840 formed of a small memory and passgate array are located between adjacent memory and passgate array 830 to selectively connect the I-Matrix lines 841–846 of a cluster to the I-Matrix of an adjacent cluster.

Selectively coupled to the elements of each cluster 820 are the block connectors which include the block connectors lines 861-868 (vertical block connectors not shown for purposes of simplification of FIG. 8A) and the memory and passgate array 850 which controls the routing of signals between the elements of the cluster and the block connector lines.

This floor plan is best realized by using a logic design that meets the following criteria. Each block provides for bidirectional input/output access in less than all possible directions (i.e., north, south, east and west) or "sides" of a block. In the present embodiment each block provides block connector tab networks on two sides of the block, one in a horizontal direction and one in a vertical direction. The block connector tab networks, which are preferably replicas of each other, are oriented mirror to each other along respective axis in a 2×2 array. This can be visualized by referring back to FIG. 7C. Referring to FIG. 7C, and in particular the orientation of the block connector tab networks, 410 is a mirror image of 450, 460 is a mirror image of 480, 440 is a mirror image of 430 and 470 is a mirror image of 450.

Continuing reference to FIG. 7C, the mirroring is performed such that the programmable switches, i.e., switches that connect elements to I-Matrix lines, switches that connect elements of clusters to block connector lines and switches that provide the I-Matrix extensions, corresponding to each block can be adjacent in the floor plan. As can be seen in FIG. 8A, a 2×2 matrix can be designed to have memory and passgate arrays 830, 840 and 850 implemented as a contiguous block of memory 855. In addition to minimizing layout dead space, this floor plan simplifies manufacture as the majority of the die consists of memory arrays with small sections of logic (e.g., logic cluster 820). Furthermore, by providing groupings of memory arrays, the programming of the chip is simplified as simple X-Y addressing can be used. One example of a contiguous memory and passgate array is shown in FIG. 9.

An additional benefit to the floor plan is that the arrangement of blocks enables a simple, effective way to enable adjacent blocks to share routing resources without adding on significantly to the number of lines or additional bits.

Figure 8B:
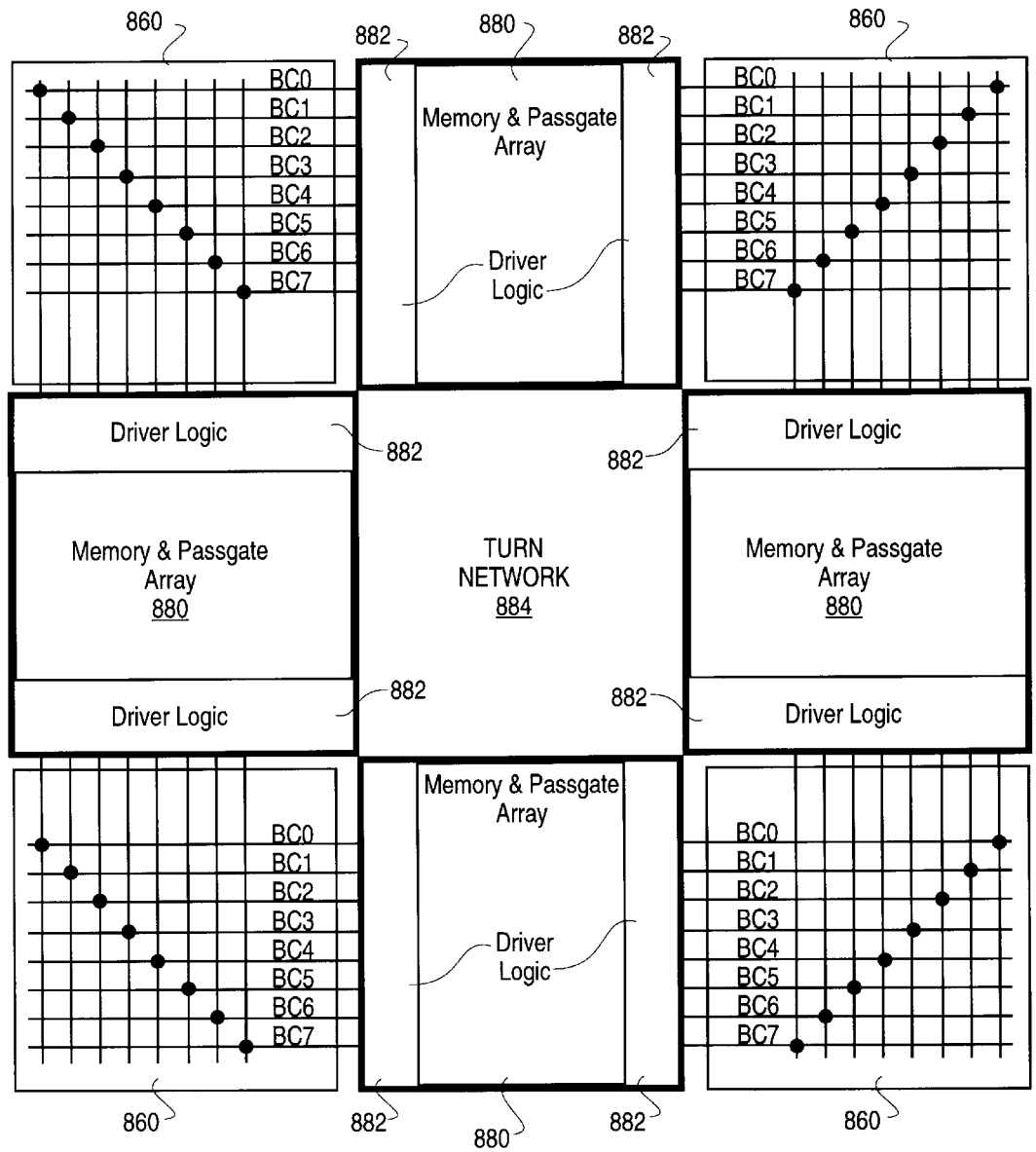
FIG. 8B is a simplified layout floor plan of a 2×2 logic block array.

FIG. 8B continues the illustration of the innovative floor plan by showing the layout for a 2×2 block. Each block (shown in outline form as element 860) includes a plurality of block connectors BC0–BC7. The floor plan of each block 860 is that described in FIG. 8A. As described previously, the block connector lines inside each 860 are coupled to block connector tab networks which provide connections to adjacent blocks and to higher level routing lines of the routing hierarchy. Memory and passgate arrays 880 represent the switches for the block connector tab networks. The driver logic 882, which includes the drivers located in the block connector tab networks, is separate from the memory and requires a small portion of the die. The turn matrix 884 is also composed of a memory and passgate array. The MLA lines, not shown, are preferably oriented in a parallel layer over memory and passgate arrays 880 and 884 to provide a simple means to control connectivity.

This floor plan is scalable by replication of the arrangement shown in FIG. 8B. As noted previously, however, to minimize loading on the lines in the present embodiment that uses partial turn matrices, it is preferred that the partial turn matrices alternate in orientation such as is shown in FIG. 7C. Once a 4×4 block matrix floor plan is realized, the realization of larger matrices is achieved by replication of the 4×4 matrix and the abutment of the routing lines and block connectors of adjacent matrices.

The advantages to such a floor plan is apparent to one skilled in the art. Enhanced usage of die space is achieved. In addition, scalability is easily achieved by replication of the layout for the logic blocks which allows for easy proliferation of varying sizes of devices to be built with minimum engineering efforts.

What is claimed is:

1. A layout of a programmable logic device comprising a plurality of configurable function generators (CFG) and storage elements, said layout comprising:

a plurality of blocks, each block comprising a plurality of CFGs and storage elements, each of said blocks paired to a first adjacent block that is adjacent in a first direction and a second adjacent block that is adjacent in a second direction; and a first block connector tab network coupled to each block of the plurality of blocks that programmably couples in the first direction the CFGs of the block to routing lines of the device and a second block connector tab network coupled to each block of the plurality of blocks that programmably couples in the second direction the CFGs of the block to routing lines of the device, the first and second block connector tab networks of paired blocks oriented to mirror images of each other, each of said first and second said block connector tab networks comprising a memory and passgate array for forming a plurality of programmable connections and driver or receiver logic for driving or receiving respectively signals, the memory and passgate arrays of paired blocks combined into a single array.

2. The layout as set forth in claim 1, wherein a block comprises a plurality of logic clusters, each logic cluster comprising a set of the plurality of CFGs and storage elements programmably interconnected via a cluster routing matrix composed of intracluster routing lines and programmable switches, a layout within each block comprising:

a memory and passgate array comprising;

a first portion comprising memory and passgates corresponding to switches of the cluster routing matrix of each logic cluster of the block;

a second portion comprising memory and passgates corresponding to switches of extensions which programmably couples cluster routing matrices of adjacent clusters within the block;

a third portion comprising memory and passgates corresponding to switches which programmably couple CFGs to block connectors, said block connectors programmably coupled to the block connector tab networks; and a plurality of logic arrays, each logic array corresponding to the CFGs of a cluster, said logic arrays located external to the area spanned by the memory and passgate array.

3. The layout as set forth in claim 1, further comprising a turn network for programmably coupling routing lines, said turn network comprising a memory and passgate array, said memory and passgate array of the turn network contiguous to the memory and passgate arrays of the first block connector tab networks and second block connector tab networks.

4. The layout as set forth in claim 1, wherein the driver or receiver logic is located adjacent to the memory and passgate array.

5. The layout as set forth in claim 1, wherein each driver or receiver logic of the first block connector tab network and second block connector tab network comprises at least one programmable driver.

6. The layout as set forth in claim 1, wherein the routing lines are organized in a hierarchy.

7. The layout as set forth in claim 1, wherein the routing lines comprise a first set of routing lines, and tab routing lines, said layout further comprising a tab routing line connector tab network coupled to each tab routing line that programmably couples the tab routing line to a second set of routing lines directly inaccessible by the first block connector tab network and second block connector tab network.

* * * * *

UNITED STATES PATENT AND TRADEMARK OFFICE
CERTIFICATE OF CORRECTION

PATENT NO. : 5,850,564
DATED : December 15, 1998
INVENTOR(S) : Ting et al.

It is certified that error appears in the above-identified patent and that said Letters Patent is hereby corrected as shown below:

In column 3 at line 23 delete "of. routing" and insert
--of routing--

Signed and Sealed this

Twenty-first Day of September, 1999

*Attest:*

Q. TODD DICKINSON

*Attesting Officer*    *Acting Commissioner of Patents and Trademarks*